United States Patent [19]

Temes

[11] Patent Number: 4,644,304
[45] Date of Patent: Feb. 17, 1987

[54] SWITCHED-CAPACITOR PSEUDO-N-PATH FILTER

[75] Inventor: Gabor C. Temes, Los Angeles, Calif.

[73] Assignee: The Regents of the University of Calif., Calif.

[21] Appl. No.: 293,469

[22] Filed: Aug. 17, 1981

[51] Int. Cl.[4] .................. H03H 11/12; H03H 17/06; H03H 19/00; H03K 5/135

[52] U.S. Cl. ..................................... 333/173; 330/9; 330/107; 328/151; 307/521

[58] Field of Search ............... 333/167, 172, 173, 165, 333/19, 214; 328/151, 167, 165; 307/241–242, 520–521; 330/9, 51, 107, 109, 294

[56] References Cited

U.S. PATENT DOCUMENTS 4,039,979  8/1977  Carbrey ........................ 328/151 X

OTHER PUBLICATIONS

Lee-"Parasitic-Insensitive Switched-Capacitor Ladder Filters", Electronics Letters, 5 Jun. 1980, vol. 16, No. 12; pp. 472-473.
Temes et al.-"Switched-Capacitor Filter Design using the Bilinear Z-Transform", IEEE Trans. on Circuits and Systems, vol. CAS-25, No. 12, Dec. 1978; pp. 1039-1043.
Ghaderi et al.-"Switched-Capacitor Pseudo-N-Path Filters", 1981 International Symposium on Circuits and Systems, Apr. 1981, Chicago, Illinois; 4 pages.
Allstot et al.-"A switched Capacitor N-Path Filter", Proc. of the international Symposium on Circuits and Systems, Apr. 1980; pp. 313-316.
Fettweis et al.-"A Solution to the Balancing Problem in N-Path Filters", IEEE Transactions on Circuit Theory, vol. CT-18, May 1971; pp. 403-405.
Fried-"Analog Sample-Data Filters", IEEE Journal of Solid-State Circuits, Aug. 1972; pp. 302-304.

Primary Examiner—Marvin L. Nussbaum
Attorney, Agent, or Firm—Poms, Smith, Lande & Rose

[57] ABSTRACT

A switched capacitor pseudo-N-path filter stage includes an analog integrator circuit having an input, an output, and a feedback capacitor connected between the input and the output. A plurality of storage capacitors are connected across the feedback capacitor and an input capacitor is provided. The feedback capacitor and storage capacitors form an analog random access memory. A switching circuit selectively connects the input capacitor across electrical ground and between an input signal and the input of the integrator circuit, and also selectively connects the feedback capacitor and the storage capacitors between electrical ground and the output of the integrator circuit. In this manner, the input signal is filtered as the input capacitor samples the input signal and the charge on the input capacitor is circulated through the feedback capacitor and the storage capacitors.

2 Claims, 12 Drawing Figures (a)

SWITCHED-CAPACITOR PSEUDO-N-PATH FILTER

FIELD OF THE INVENTION

The present invention relates in general to electrical filters and filtering techniques and, in particular, to analog sampled-data filters.

BACKGROUND OF THE INVENTION

Switched-capacitor filters provide a practical method for the fully-integrated realization of high-quality filters. The basic motivation for the development of the switched-capacitor filter was the need to obtain fully-integrated high-quality frequency-selective devices. Integrated circuits cannot contain high-Q inductors, since the quality factor Q decreases with decreasing size. Resistors can be integrated, but they are nonlinear, occupy a large area on the chip, and their tolerances and temperature coefficients do not track with those of the capacitors on the same chip. Hence, neither the time constants nor the pole positions of the filter can be accurately controlled. High-quality capacitors, by contrast, can be realized conveniently in an MOS integrated circuit. The dielectric material is $SiO_2$, an excellent insulator. The electrodes can be made of metal, or polycrystalline silicon, or heavily doped crystalline silicon. In any presently available construction, the structure is planar, positioned parallel with the surface of the chip. Hence the bottom plate, which is in the substrate or close to it, is coupled to the substrate by a stray capacitance. The stray capacitance is usually 5–20% of the main capacitance, and is nonlinear. Due to the interconnecting lines connected to the top plate of the main capacitor, a stray capacitance also exists between the top plate and ground (substrate). It is typically 0.1–5% of the main capacitance and also may be nonlinear.

Good switches can also be fabricated using MOS technology. The on-resistance depends on the area allowed for the MOS transistor used as the switch; 1000 ohms can readily be attained. The off-resistance is, for practical purposes, infinite. The stray capacitors between the gate (where a large clock signal exists, turning the switch on or off) and drain and source (connected to the rest of the switched-capacitor filter) are of the order of 2–10 fF. They can play an important role in causing clock-signal feedthrough and dc offset.

A key component of switched-capacitor filters is the active element, almost always an operational amplifier (opamp). Opamps with up to 90 dB dc gain, unity-gain bandwidth of 5 MHz and dc power drain of 2 mW are now practical. In terms of chip area, an opamp occupies about as much space as a 50 pF capacitor. It is also (along with clock feedthrough) the major source of noise in the switched-capacitor filter.

Because of the availability and properties of the components described above, the switched-capacitor filter utilizes only capacitors, switches and opamps. Superficially, a capacitor with one or more associated switches can be used to first store and then dissipate electric energy, and thus act as a simulated resistor. Using capacitors, simulated resistors and opamps, one can also simulate inductors and/or FDNR's. Hence, in principle, any passive and/or active filter response can be obtained by a switched-capacitor filter. From dimensional considerations, it can readily be seen that the voltage gain of such a circuit will depend only on the ratios of capacitances, which can be closely controlled.

Figure 1:
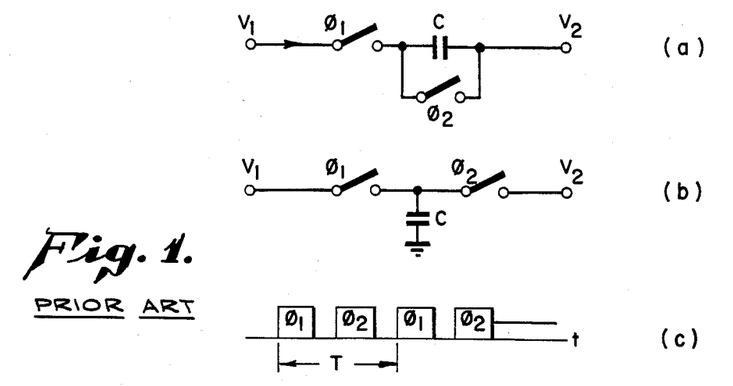
FIGS. 1–3 demonstrate the prior art concept of resistance simulation by a switched capacitor filter.
Figure 2:
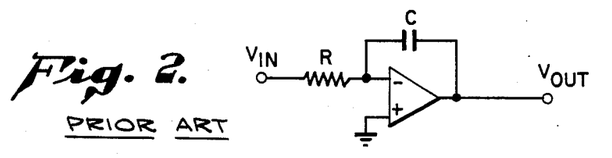

The basic concept behind the switched-capacitor filter is known in the prior art and is illustrated in FIG. 1. The concept is based on resistance simulation. Referring to FIG. 1 and assuming that the variation of the voltages $v_1$ and $v_2$ during a clock period T is negligible, the charge $q(t)$ which enters the input terminal and leaves the output terminal between $t$ and $t+T$ is given by $[v_1(t) - v_2(t)]C$. Thus, the average current is $[v_1(t) - v_2(t)]/(T/C)$, the same as would flow through a resistor $R = T/C$ connected between the input and output terminals. Thus, for signals whose highest frequency component is much less than the clock frequency $f_c = 1/T$, either of the circuits of FIG. 1 will simulate such a resistor. This analogy has opened up the whole wealth of active filter realizations for conversion to equivalent switched-capacitor filter circuits. The basic building block in all these switched-capacitor filters is the equivalent of the active $-RC$ integrator (FIG. 2). The transfer function of the circuit is $$H(s) = \frac{V_{out}(s)}{V_{in}(s)} = \frac{-1}{SRC} \quad (1)$$

where s is the Laplace-transform variable. Replacing R by either of the equivalents in FIG. 1, the SC form is obtained.

Figure 3:
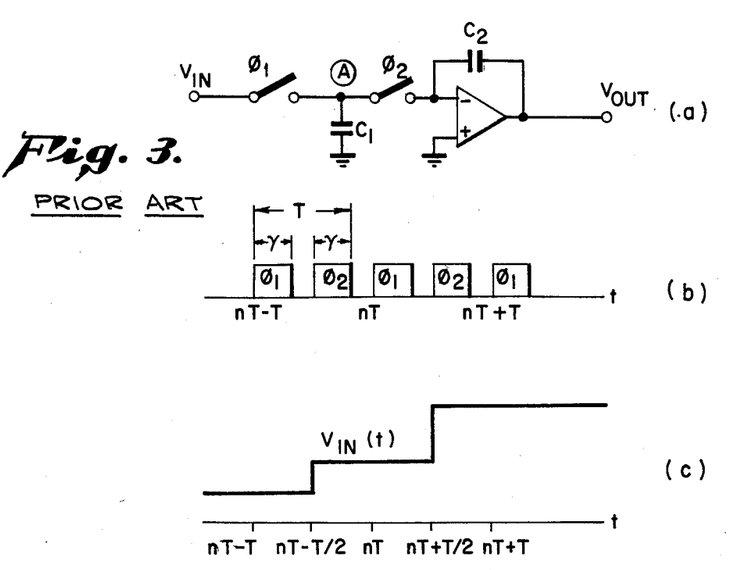

Unfortunately, this simple approach gives good results only if a very large ratio (say, 50 or more) of the clock frequency to the highest signal component can be maintained. To see the limitations involved, consider using the circuit of FIG. 1b to simulate R in FIG. 2 (FIG. 3). At $t = t_n \triangleq nT$ (where $v$ is an integer), $C_1$ acquires a charge $C_1 v_{in}(t_n)$; at $t = t_{n\frac{1}{2}} \triangleq nT + /2$, it dumps the charge into $C_2$. Thus, $v_{out}$ satisfies $$v_{out}(t_{n+\frac{1}{2}}^+) - v_{out}(t_n) = -\frac{C_1}{C_2} v_{in}(t_n) \quad (2)$$

It should be carefully noted that the foregoing equation is valid only because $v_{in}(t)$ is assumed to be a sampled-and-held waveform—otherwise, $v_{in}(t_n+T)$ would have to be used (FIG. 3c). Also, it follows from FIGS. 3a and b that $v_{out}(t)$ is also a staircase signal, so that $v_{out}(t_{n+\frac{1}{2}}) = v_{out}(t_{n+1})$. Thus, regarding $v_{out}(t_n)$ and $v_{in}(t_n)$ as sequences, and taking the z-transform of (2), $$V_{out}(z) = -V_{in}(z) \frac{C_1/C_2}{z-1} \quad (3)$$

results. The desired frequency response, from (1), is $H(j) = -1/(jRC)$; the one obtained from (3) is $$H'(e^{j\omega T}) = \frac{-C_1/C_2}{(\cos\omega T - 1) + j\sin\omega T} \quad (4)$$

If $0 < \omega T << 1$, then $|\cos \omega T - 1| << \sin \omega T \approx \omega T$, so that $H' \approx -(C_1/C_2)/j\omega T$. Thus, for $C_2/C_1 = RC/T$, $H'(e^{j\omega T}) \approx H(j\omega)$.

Using the circuit of FIG. 3, or other similar integrators, switched-capacitor filters can be constructed successfully. However, for the important case of narrow-band bandpass filters, the resulting circuit is too sensitive to variations of the capacitance values and the imperfections of the amplifiers. Hence, only other principles, such as that of the pseudo-N-path filter, are practical.

Figure 4:
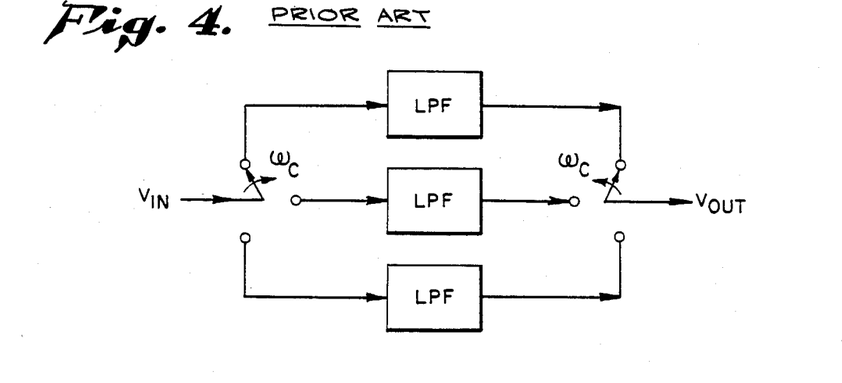
FIG. 4 shows a prior art N-path filter.

An understanding of an N-path filter is helpful to the understanding of a switched-capacitor pseudo-N-path filter. N-path filters were introduced originally for analog filter realization. The basic block diagram for a 3-path filter (N=3) is shown in FIG. 4. In this system, a number of unwanted "mirror frequencies" are generated along with the desired signal. If a perfect match exists between the N paths, then the phasors of the unwanted mirror frequencies form a polygon with zero resultant. Otherwise they appear at the output, including a component at the center of the passband.

Pseudo-N-path analog filters were developed to overcome this sensitivity to path mismatch. In these filters only one physical path exists; however, each memory-possessing element in the path is connected to a circulating delay line, which discharges and recharges these elements such that the overall circuit represents various paths in different clock phases. This approach thus eliminated the passband distortion due to mismatch of filter's paths; however, the circuit was complicated and the imperfections of the delay devices affected the performance.

The N-path principle was then extended to switched-capacitor filters. N=4 was used and a clock frequency of N$\omega$c was applied to the switched-capacitor filter. The circuit was obtained by the LDI s-to-z transformation of an analog prototype; thus, some loss distortion was introduced due to the approximation used for terminations (although this is not very significant for narrow-band bandpass filters). All memory possessing capacitors were replaced by N identical capacitors which were commutated to provide the N signal paths. Obviously, any mismatch between these capacitors resulted in path mismatch, and introduced unwanted frequencies in the passband.

It was subsequently found that by using the frequency transformation $z \rightarrow z^N$, and the bilinear s-to-z transformation, an exact low-path to N-path mapping could be obtained. The resulting circuit was free from some approximation errors inherent in the earlier circuits. The $z \rightarrow z^N$ transformation corresponds to an $N^{th}$-order reactance transformation of the analog prototype filter. A straightforward application of this procedure, however, resulted in a circuit which needed more memory-possessing capacitors than that of the earlier circuits, and since each of these capacitors should be replaced by N identical capacitors, the circuit becomes more complicated and thus more vulnerable to mismatch of paths.

Therefore, while the prior art teaches the concept of the pseudo-N-path switched capacitor filter, the resulting circuits are very cumbersome, and are susceptible to the path mismatch problem, with the resulting unwanted frequencies in the output. Furthermore, the previous circuits have the undesirable requirement of either using a recirculating analog shift register or requiring multiplexed capacitors. Finally, the cumbersome nature of the prior art circuits makes them generaly unsuitable for monolithic integration.

Accordingly, it is the principal object of the present invention to reduce and eliminate distortion in a pseudo-N-path switched-capacitor filter.

It is a further object of the present invention to reduce multiplexing of capacitors in a switched-capacitor pseudo-N-path filter.

It is yet another object of the present invention to produce a switched-capacitor pseudo-N-path filter with a minimum number of components.

SUMMARY OF THE INVENTION

The present invention, in a broad aspect, provides a switched capacitor filter stage utilizing an operational amplifier. A plurality of switched storage capacitors and a feedback capacitor each have a first end connected to the input of the amplifier and a second end selectively switchable between the output of the amplifier and electrical ground. A switch input capacitor has two ends each selectively switchable to connect the input capacitor either between the amplifier input and an input signal or across electrical ground. A switching circuit selectively switches the ends of the capacitors between their respective positions to sample the input signal by charging the input capacitor and thereafter recirculating the charge through the feedback capacitors to filter the signal.

The resulting filter is free from loss distortion, and does not require the multiplexing of all capacitors, as does the prior art. Accordingly, the present invention results in a significantly simpler circuit. More importantly, the circuit is immune to mismatches among those capacitors which are multiplexed. The resultant filtering is dependent only upon the values of the input capacitor and the feedback capacitor and the rate at which the various capacitors are innerconnected. The resulting circuit provides a basic building block for use in larger filtering arrays.

Other objects, features, and advantages of the present invention will become apparent in consideration of the following detailed description and from the accompanying drawings.

DETAILED DESCRIPTION

The present invention, as described hereinafter, possesses the combined advantages of the prior art circuits. It is based on the bilinear s-to-z transformation of a bilinear low-pass filter and on the $z \rightarrow z^N$ mapping. It is thus free from loss distortion resulting from the imperfect approximation of terminations. However, it does not require the multiplexing of all memory-possessing capacitors as do the prior approaches, and, hence, it results in a significantly simpler circuit. Even more importantly, this circuit is immune to mismatches among the multiplexed capacitors (as long as the d.c. gain of the opamps is sufficiently high); hence, spurious signals at $n\omega_c$ can only be caused by unsymmetries in the clock feed-through of the switches connected to the multiplexed capacitors.

Figure 5:
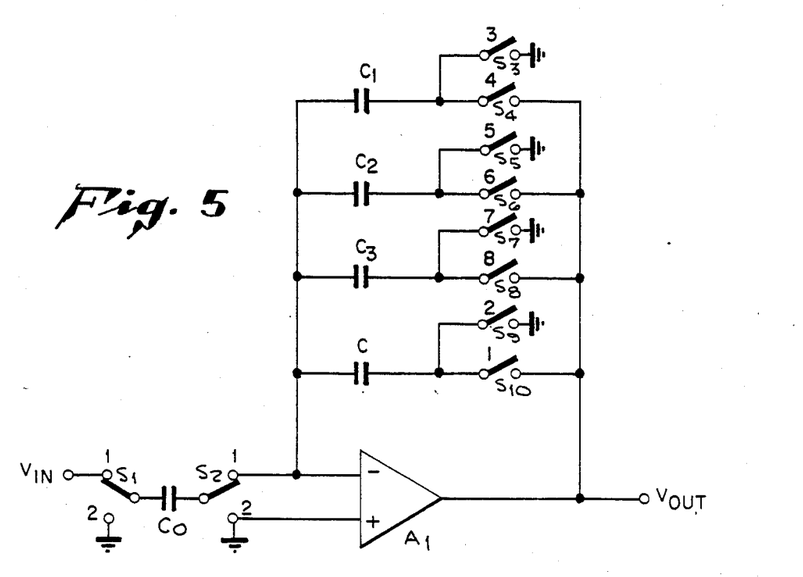
FIG. 5 shows a schematic diagram of a switched-capacitor pseudo-N-path filter section according to the present invention.
Figure 6:
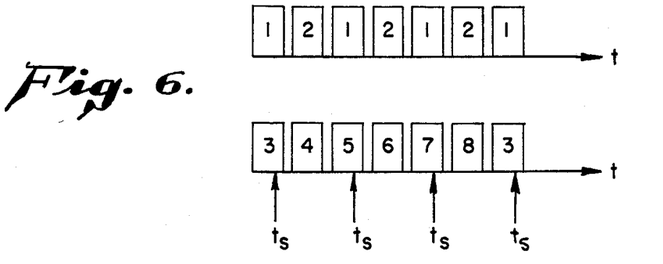
FIG. 6 shows a timing diagram for the circuit of FIG. 5.

FIG. 5 shows a fast switched-capacitor pseudo-N-path filter according to the present invention which utilizes analog random-access memories. FIG. 5 shows an integrator circuit using the following three elements: an operational amplifier A1, an input capacitor C0, a feedback capacitor C, and a plurality of storage capacitors C1–C3. The capacitors C and C1–C3 form the analog random-access memory. Additionally, the circuit includes a series of ten switches S1–S10 connected as shown. These switches in actual implementation are MOS transistors, rather than discrete toggle switches. The numbers adjacent to the switches, 1–8, indicate, for S1 and S2, the changing positions of the switches with each clock phase and, for S2–S10, the clock phases at which the switches are closed relative to the timing diagram shown in FIG. 6. Thus, referring to FIG. 6, the two left-most pulses labelled 1 and 3 indicate that, at clock phase 1, switches S1 and S2 are in the "1" position, switch S3 is closed, and switch S10 is closed, with the remainder of the switches being open. At clock phase 2 in FIG. 6 (showing pulses labelled 2 and 4 coincident), switches S1 and S2 are in the "2" position, switch S4 is closed, and switch S9 is closed, with the remainder of the switches being open. It is to be noted that the $t_s$ indicated in FIG. 6 are the points in time at which the output of the stage is sampled.

Conventional logic circuitry means as known in the art is used to effect the switch closures at the desired intervals, and has not been shown in the drawings.

With the clock phasing as illustrated, the transfer function of the circuit shown in FIG. 5 is:

$$H_1(z) = -\frac{C_o/C}{1 - z^{-3}}. \tag{5}$$

If the phases 1 and 2 of the two switches connected to the right-side terminal of input capacitor C0 are interchanged, the transfer function becomes:

$$H_2(z) = \frac{C_o}{C} \frac{z^{-3}}{1 - z^{-3}}. \tag{6}$$

Clearly, H1(z) and H2(z) are related to the responses of the usual inverting and noninverting switch-capacitor integrators by the desired z-to-$z^3$ transformation. Hence, these circuits form the required building blocks for the N-path filter realization. Also, they are obviously insensitive to parasitic-capacitor effects.

The circuit shown in FIG. 5 is also immune to mismatch between the values of C, C1, C1 and C3. During clock phases, 1, 3, the charge in C1 is transferred into C (which was fully discharged during the preceding clock phase). At the same time, the charge $C0V_{in}(t)$ from the input capacitor C0 is also transferred into C. Since the charge in C1 was $CV_{out}(n-3)$ the following equation holds:

$$CV_{out}(n) = CV_{out}(n-3) - C_o v_{in}(n). \tag{7}$$

By the z-transformation, H1(z) follows directly.

The operation can be analyzed in a similar way for the modified clocking scheme. In this case, the charge from the input capacitors is initially stored, along with the charge due to the input voltage, in one of the storage capacitors C1, C2 or C3. Three clock periods later, the stored charge is reloaded into C and sensed at the output. Hence, the input-output relation is now:

$$CV_{out}(n) = CV_{out}(n-3) + C_o v_{in}(n-3). \tag{8}$$

This equation leads directly to H2(z). It should be noted that C1, C2 and C3 are only used as temporary storage, and hence their values in matching do not influence their response.

The operation of the circuit shown in FIG. 5 can be best understood by referring to Tables 1 and 2. Table 1 shows the activity in the circuit at each of the six clock phases shown in FIG. 6, while Table 2 shows the charges on each of the capacitors at each of the clock phases shown in FIG. 6.

TABLE 1

| | ACTIVITY MATRIX | | | | | |
|---|---|---|---|---|---|---|
| Clock Phase | 1 | 2 | 3 | 4 | 5 | 6 |
| Switch Positions | 1-3 | 2-4 | 1-5 | 2-6 | 1-7 | 2-8 |
| $C_0$ | Charges | Discharges | Charges | Discharges | Charges | Discharges |
| C | Charges | Discharges | Charges | Discharges | Charges | Discharges |
| $C_1$ | Discharges | Charges | Holds | Holds | Holds | Holds |
| $C_2$ | Holds | Holds | Discharges | Charges | Holds | Holds |
| $C_3$ | Holds | Holds | Holds | Holds | Discharges | Charges |

TABLE 2

| | CHARGE MATRIX | | | | | |
|---|---|---|---|---|---|---|
| Clock Phase | 1 | 2 | 3 | 4 | 5 | 6 |
| $C_0$ | $C_0V_{in}(t)$ | 0 | $C_0V_{in}(t)$ | 0 | $C_0V_{in}(t)$ | 0 |
| C | $Q_{C_0} + Q_{C_1}$ | 0 | $Q_{C_0} + Q_{C_2}$ | 0 | $Q_{C_0} + Q_{C_3}$ | 0 |
| $C_1$ | 0 | $Q_C$ | $Q_C$ | $Q_C$ | $Q_C$ | $Q_C$ |
| $C_2$ | $Q_C$ | $Q_C$ | 0 | $Q_C$ | $Q_C$ | $Q_C$ |
| $C_3$ | $Q_C$ | $Q_C$ | $Q_C$ | $Q_C$ | 0 | $Q_C$ |

Turning first to Table 1, it is seen that at clock phase 1, switches S1 and S2 are in the "1" position while switches S3 and S10 are closed. Accordingly, input capacitor C0 is connected between the input voltage $V_{in}$ and the negative input terminal of amplifier A1; feedback capacitor C is connected between the output and negative input of amplifier A1; and one end of storage capacitor C1 is connected to ground. Accordingly, input capacitor C0 charges up to the value of the input voltage $V_{in}$ and a charge proportional to the full value of that input voltage is transferred to capacitor C. As one end of storage capacitor C1 is connected to ground, the charge on capacitor C1 is likewise transferred to capacitor C. Therefore, at the end of clock phase 1, input capacitor C0 is charged with the value of the sampled input voltage; capacitor C1 is discharged; and feedback capacitor C is charged with the total value of the voltage previously on capacitor C1 plus the value of the voltage on input capacitor C0. During clock phase 1, there is no change of the value of the voltages on capacitor C2 and C3.

During the second clock phases, switches S1 and S2 are both in the "2" position, and switches S4 and S9 are closed, with the remainder of the switches being open. This configuration completely discharges the input capacitor C0 across ground, and connects storage capacitor C1 between the output and the negative input of amplifier A1. Likewise, one end of capacitor C is connected to ground, thereby transferring the full charge on capacitor C to capacitor C1. Therefore, at the end of clock phase 2, input capacitor C0 and feedback capacitor C are both discharged, and the charge previously on capacitor C is transferred to storage capacitor C1.

During clock phase 3, switches S1 and S2 are again connected to the "1" position, and switches S5 and S10 are closed. This again connects the input capacitor C0 between the input voltage and the negative terminal of the operational amplifier A1; connects feedback capacitor C between the output and negative input of amplifier A1; and grounds one end of storage capacitor C2. As was the case during clock phase 1, this results in input capacitor C0 charging to the current value of the input voltage, and feedback capacitor C having the total charge on C0 plus that of capacitor C2, and C2 is discharged. During clock phase 3, there is no change in the value of the voltages on storage capacitor C1 and C3.

During clock phase 4, switches S1 and S2 are again at the "2" position (thereby discharging input capacitor C0), and switches S9 and S6 are closed. This places storage capacitor C2 across the operational amplifier and transfers the total charge previously on feedback capacitor C to capacitor C2, thereby discharging capacitor C.

During clock phase 5, with the switches as indicated in Table 1, input capacitor C0 again charges to the value of the input voltage; storage capacitor C3 is configured to discharge; and, capacitor C charges to the values of the voltages on C0 and C3.

During clock phase 6, input capacitor C0 discharges, and feedback capacitor C transfers its total charge to storage capacitor C3. Thus, at the end of clock phase 6, the input and feedback capacitors are discharged, and the storage capacitors are fully charged. The transfer of charge between the various capacitors effects a filtering of the signal.

As seen from the foregoing, the entire technique of sampled-data filtering requires the continual updating of charges by various incremental charge quantities entering the filter from the input capacitor. The storage capacitors C1, C2, and C3 form the elements of a memory which store and replace charges in and out of the feedback capacitor C. Their values do not affect the transfer function of the stage. With n=3, it requires 4n=12 clock phases to perform a full cycle of filtering operation.

Figure 7:
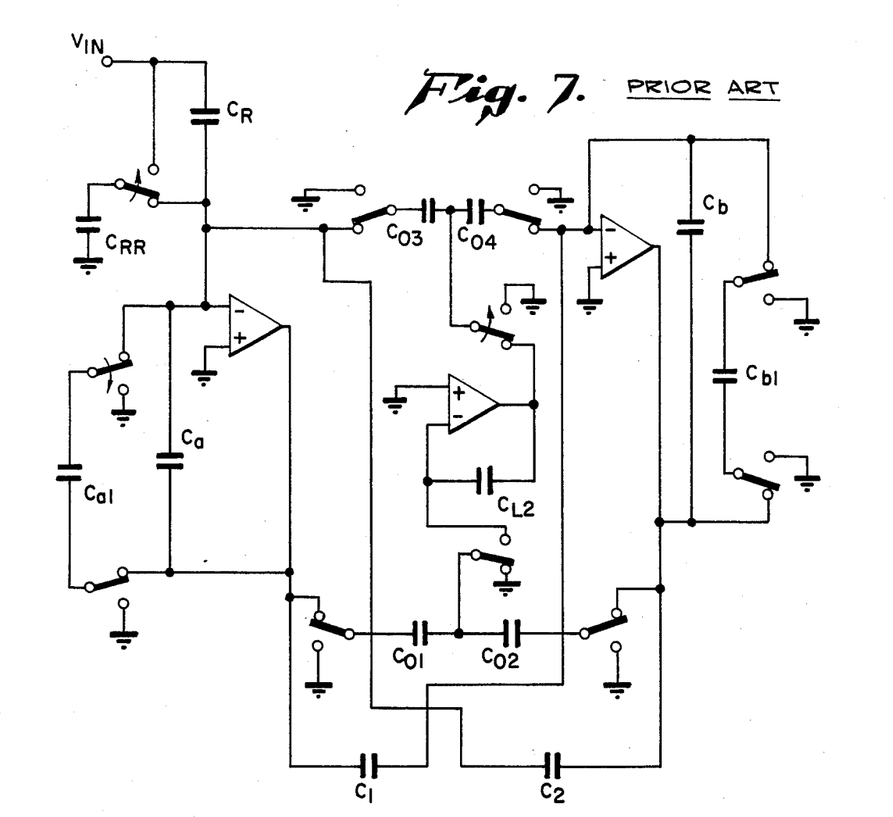
FIG. 7 shows a prior art bilinear ladder filter.
Figure 8:
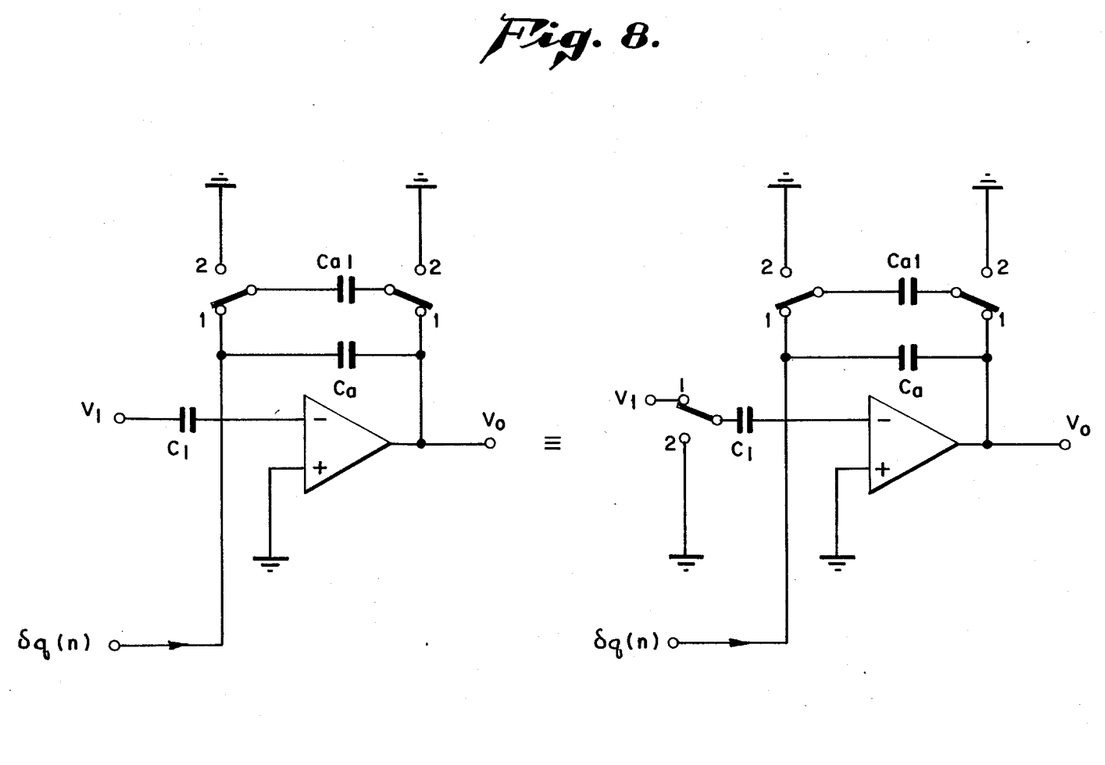
FIG. 8 shows equivalent circuits for two alternate configurations of a switched-capacitor filter element according to the present invention.

FIG. 7 shows a prior art bilinear ladder filter, corresponding to a third-order elliptic low-pass filter. In this circuit, the integrator stages can be replaced directly by the circuit of FIG. 5. However, there are two additional fixed capacitors C1 and C2 in the circuit. These would also require multiplexing in the N-path structure. It can be shown, however, that the circuit equivalence shown in FIG. 8 holds, wherein both output voltages are sampled only during phase 1 of the clock signal. This makes possible the replacement of fixed capacitors C1 and C2 by switched (and hence memoryless) capacitive branches which need no multiplexing. The clock scheme for the switching of the circuits in FIG. 7 is shown in FIG. 8.

Figure 9:
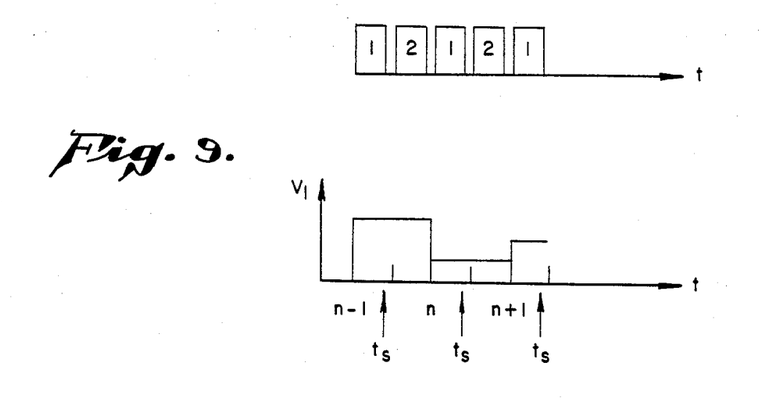
FIG. 9 shows a timing diagram for FIG. 8.

The resulting N-path filter after the replacement is shown in FIG. 9. In this circuit, the input branch (CR and CRR) has also been replaced by a stray-capacitive-insensitive equivalent circuit. This final circuit is economical, stray-insensitive, and totally independent of the matching of the multiplexed capacitors contained in branches A, B and C. Accordingly, it holds promise for successful realization in integrated form.

Figure 10:
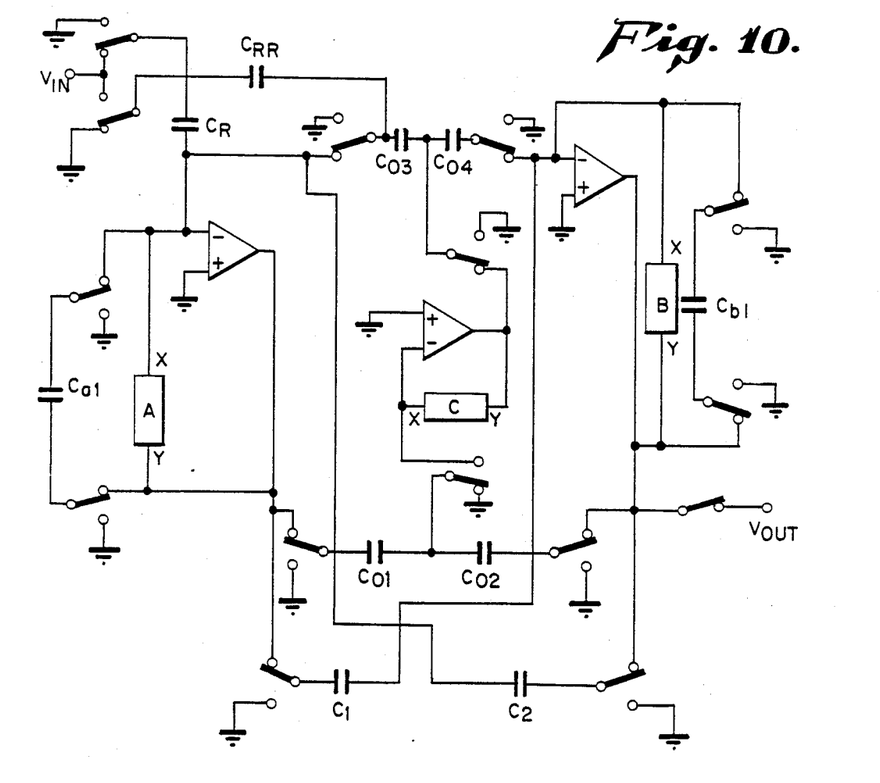
FIG. 10 shows the bilinear ladder filter of FIG. 7 incorporating switched-capacitor pseudo-N-path filter elements according to the present invention.
Figure 11:
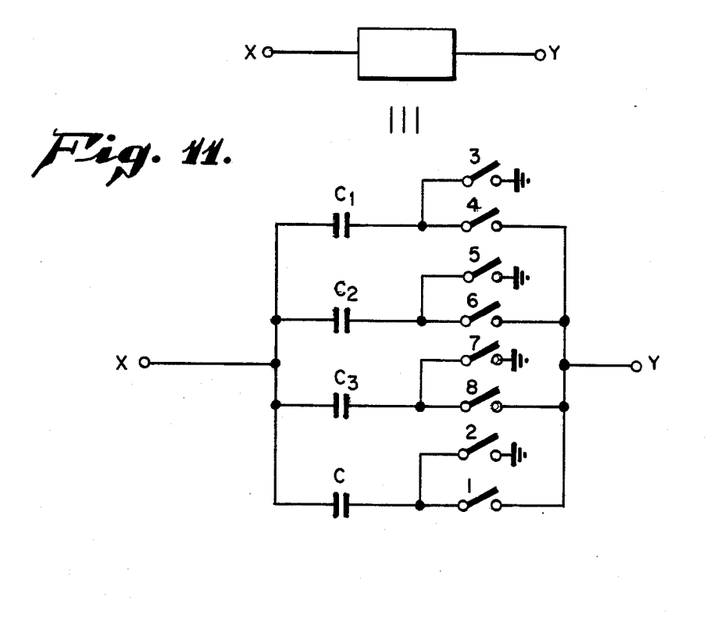
FIG. 11 shows a schematic diagram of the elements denoted A, B, and C in FIG. 10.
Figure 12:
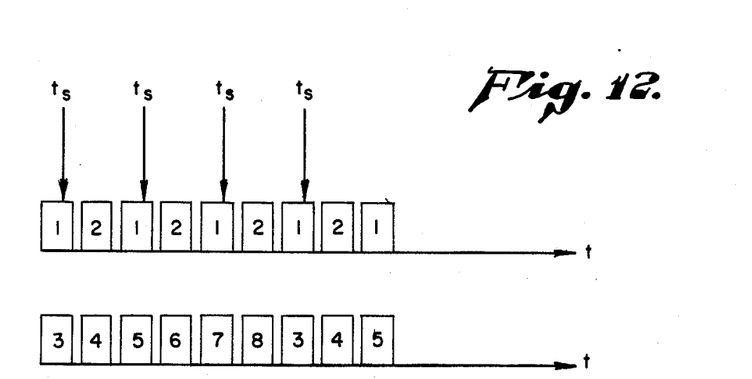
FIG. 12 shows a timing diagram for the circuit of FIG. 11.

The elements which comprise the branches A, B, and C in FIG. 9 are shown in FIG. 10. The switching scheme for them is shown in FIG. 11, in a manner similar to FIG. 4. Regarding FIG. 9, it is noted that multiplexing of capacitors takes place only in the feedback branches of the amplifiers. The response is independent of the matching of the storage capacitors contained in branches A, B, and C. The circuit needs a sample and hold input signal with the clock phasing illustrated in FIG. 5. A full cycle requires six clock phases.

In experimental testing, excellent results have been obtained with the filter shown in FIG. 9.

In the foregoing description of the present invention, a preferred embodiment of the invention has been disclosed. It is to be understood that other design variations fall within the scope of the present invention. Accordingly, the invention is not limited to the particular arrangement which has been illustrated and described in detail herein.

What is claimed is:

1. In an active filter of the type including an operational amplifier having an input and output, a plurality of storage capacitors, and a feedback capacitor, with all of said capacitors having a first end coupled to said amplifier input and a second end switchable between said amplifier output and electrical ground, and an input capacitor having two ends switchable to connect said input capacitor either between an input signal and said amplifier input or across said ground, the improvement comprising:
   switching means for switching said ends of capacitors in a sequence such that:
   (1) said input capacitor alternately charges from said input signal and discharges to ground,
   (2) said storage capacitors are sequentially connected to said ground coincident with said charging of said input capacitor, and said input capacitor is connected to said feedback capacitor during said charging, thereby transferring the total charge upon said connected one of said storage capacitor and on said input capacitor to said feedback capacitor and discharging said storage capacitor, and
   (3) said storage capacitors are sequentially connected across said feedback capacitor coincident with said discharging of said input capacitor and said feedback capacitor is simultaneously connected to ground, thereby transferring the charge on said feedback capacitor to the connected one of said storage capacitors,
   whereby said filter integrates an analog signal in a manner dependent only on the values of said capacitors and the rate at which said switching means switches said capacitors.

2. A method of operating a switched capacitor filter to filter an analog signal, said filter being of the type having an operational amplifier, an input capacitor selectively connectable between said signal and the input of said amplifier, and a feedback capacitor and a plurality of storage capacitors all having one end coupled to said amplifier input and a second end selectively connectable between said amplifier output and electrical ground, said method comprising:

alternately charging said input capacitor with said analog signal and discharging said input capacitor to said ground;

sequentially connecting said second end of said plurality of storage capacitors to said ground coincident with said charging of said input capacitor, while connecting said second end of feedback capacitor to said amplifier output and connecting said input capacitor means to said feedback capacitor, thereby transferring the total charge on said connected one of said storage capacitors and on said input capacitor to said feedback capacitor and discharging said connected storage capacitor; and sequentially connecting said second end of said plurality of storage capacitors to said amplifier output coincident with said discharging of said input capacitor and connecting said second end of said feedback capacitor to said ground, thereby transferring the charge on said feedback capacitor to the connected one of said storage capacitors, whereby the cyclic transfer of charges between the aforesaid capacitors integrates said input signal in a manner dependent only upon the values of said input capacitor and said feedback capacitor and the rate at which said capacitors are interconnected.

* * * * *